US005814832A

United States Patent [19]
Takeda et al.

[11] Patent Number: 5,814,832

[45] Date of Patent: Sep. 29, 1998

[54] ELECTRON EMITTING SEMICONDUCTOR DEVICE

[75] Inventors: Toshihiko Takeda, Tokyo; Takeo Tsukamoto; Nobuo Watanabe, both of Atsugi; Masahiko Okunuki, Tokyo, all of Japan

[73] Assignee: Canon Kabushiki Kaisha, Tokyo, Japan

[21] Appl. No.: 478,656

[22] Filed: Jun. 7, 1995

Related U.S. Application Data

[63] Continuation of Ser. No. 259,130, Jun. 13, 1994, abandoned, which is a continuation of Ser. No. 920,164, Jul. 27, 1990, abandoned, which is a continuation of Ser. No. 578,211, Sep. 6, 1990, abandoned.

[30] Foreign Application Priority Data

| | | | |
|---|---|---|---|
| Sep. 7, 1989 | [JP] | Japan | 1-233943 |
| Sep. 7, 1989 | [JP] | Japan | 1-233945 |
| Aug. 22, 1990 | [JP] | Japan | 2-221713 |

[51] Int. Cl.$^{6}$ .......................... H01L 29/06; H01L 29/04; H01L 29/47

[52] U.S. Cl. ................................ 257/10; 257/54; 257/73; 257/155; 257/192; 257/217; 257/267; 257/269; 257/280; 257/281; 257/928

[58] Field of Search ................................ 357/13, 15, 58, 357/52, 91, 55, 54; 257/10, 54, 73, 155, 192, 217, 267, 269, 280, 281, 928

[56] References Cited

U.S. PATENT DOCUMENTS

| | | | |
|---|---|---|---|
| 4,259,678 | 3/1981 | Van Gorkom et al. | 357/13 |
| 4,303,930 | 12/1981 | Van Gorkom et al. | 357/13 |
| 4,641,174 | 2/1987 | Baliga | 357/58 |
| 4,766,340 | 8/1988 | van der Mast et al. | 313/366 |
| 4,783,688 | 11/1988 | Shannon | 357/15 |
| 4,894,611 | 1/1990 | Shimoda et al. | 324/158 |
| 4,906,833 | 3/1990 | Miyawaki et al. | 250/213 |
| 4,974,736 | 12/1990 | Okunuki et al. | 219/121.12 |
| 5,138,402 | 8/1992 | Tsukamoto et al. | 357/91 |

FOREIGN PATENT DOCUMENTS 0331373 9/1989 European Pat. Off. .

*Primary Examiner*—Carl W. Whitehead

[57] ABSTRACT

An electron emitting semiconductor device is provided with a P-type semiconductor layer arranged on a semiconductor substrate having an impurity concentration. A Schottky barrier electrode is arranged on a surface of the P-type semiconductor layer. Plural $P^{+}$-type area units are positioned under and facing the Schottky barrier electrode. An $N^{+}$-type area is disposed in the vicinity of the $P^{+}$-type units. The impurity concentration is such as to cause an avalanche breakdown in at least a portion of the surfaces.

7 Claims, 6 Drawing Sheets

ELECTRON EMITTING SEMICONDUCTOR DEVICE

This application is a continuation of application Ser. No. 08/259,130 filed Jun. 13, 1994, now abandoned, which was a continuation of application Ser. No. 07/920,164, filed Jul. 27, 1990, now abandoned which was a continuation of application Ser. No. 07/578,211, filed Sep. 6, 1990, now abandoned.

BACKGROUND OF THE INVENTION

1. Field of the Invention

The present invention relates to an electron emitting semiconductor device.

2. Related Background Art

Among conventional electron emitting semiconductor devices, those utilizing avalanche amplification are disclosed for example in the U.S. Pat. Nos. 4,259,678 and 4,303,930.

In such electron emitting semiconductor devices, an electron emitting part is constructed by forming a P-type semiconductor layer and an N-type semiconductor layer on a semiconductor substrate and reducing the work function of the surface of said N-semiconductor layer by depositing cesium or the like, and an inverse bias voltage is applied across the diode composed of said P-type and N-type semiconductor layers to induce avalanche amplification, whereby electrons are rendered "hot" and emitted from the electron emitting part in a direction perpendicular to the surface of the semiconductor substrate.

However, such conventional electron emitting semiconductor devices have been associated with the several following drawbacks, because cesium employed in the electron emitting part is chemically very active:

(1) Extremely high vacuum ($1\times10^{-10}$ Torr or lower) is required for stable operation;

(2) Service life and efficiency depend strongly on the level of vacuum; and (3) Device cannot be exposed to air.

Also in such conventional electron emitting semiconductor devices, since the electrons which have acquired strong energy by avalanche amplification reach the surface of the electron emitting part through the N-type semiconductor layer, a considerable part of said energy is inevitably lost for example by lattice scattering in said N-type semiconductor layer. In order to reduce such energy loss, the N-type semiconductor layer has to be formed extremely thin (200 Å or less), but formation of such extremely thin N-type semiconductor layer with sufficient uniformity and low defect rate is difficult, so that stable preparation of the device is therefore difficult.

SUMMARY OF THE INVENTION

The object of the present invention is to provide an electron emitting semiconductor device not associated with the drawbacks of the prior technology and capable of uniform electron emission over a wide range of arbitrary shapes.

The foregoing object can be attained, according to the present invention, by an electron emitting semiconductor device comprising a P-type semiconductive layer formed on a semiconductive substrate; a Schottky barrier electrode formed on said P-type semiconductor layer; plurality $P^{+}$type-area units formed under said Schottky barrier electrode; and an $N^{+}$-type area formed in the vicinity of said $P^{+}$-type area units.

DETAILED DESCRIPTION OF THE PREFERRED EMBODIMENTS

The electron emitting semiconductor device of the present invention, in which a Schottky electrode for a P-type semiconductor layer is composed of an area doped with a material for reducing the work function of the surface of the electron emitting part (said material being hereinafter called work function reducing material), can form the electron emitting part in the direction of cross section of the substrate, and can also have plural electron emitting parts of arbitrary shapes in a single device.

Also since the work function reducing material employed in the present invention is an element extremely stable in the air, the device of the present invention does not require an ultra high vacuum for stable operation, does not show strong dependence of service life and efficiency on the level of vacuum, and can even by exposed to the air. Conventional electron emitting semiconductor devices show a large energy loss in the N-type semiconductor layer because of the use of PN junction, so that the material of an extremely low work function has to be used. In practice, therefore, cesium alone has been used for this purpose. On the other hand, the device of the present invention shows a smaller energy loss than in the conventional devices because of the use of a Schottky junction, so that the usable work function reducing materials include metals of groups IA, IIA and IIIA of the periodic table and of lanthanoid, and silicides, borides and carbides of such metals. More specific examples of said material include TiC, ZrC, HfC, $LaB_6$r $SmB_6$, $GdB_6$, $WSi_2$, $TiSi_2$, $ZrSi_2$ and $GdSi_2$.

Besides, different from the conventional electron emitting semiconductor devices, the electrons which have acquired high energy by avananche amplification need not go through the N-type semiconductor layer for reaching the surface of the electron emitting part. Consequently the device of the present invention is not associated with the difficulty in manufacture such as the necessity of forming an extremely thin N-type semiconductor semiconductor layer, for example 200 Å or less, and can therefore be manufactured in stable manner.

In the following the present invention will be clarified in greater detail, with reference to FIGS. 1 and 2.

Figure 1:
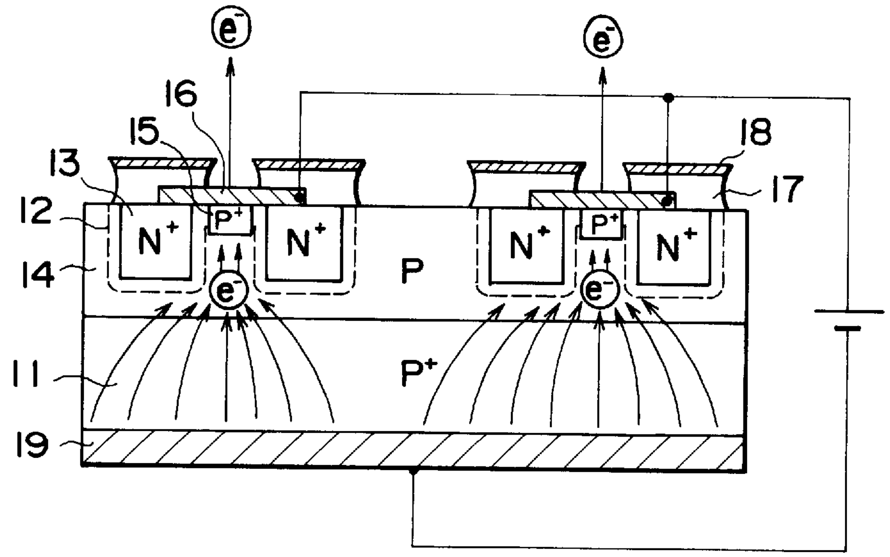
FIG. 1 is a view showing the working principle of the electron emitting semiconductor device of the present invention.

FIG. 1 is a schematic view of an example of the electron emitting semiconductor device of the present invention, showing the working principle thereof. In FIG. 1, there are shown a semiconductive substrate 11; a depletion layer area 12; an n area 13; a p-semiconductor layer 14; a $p^-$ area unit 15; a Schottky electrode 16; an n-ohmic electrode 18; and p-ohmic electrode.

The semiconductor material to be employed in the electron emitting device of the present invention can for example be Si, Ge, GaAs, GaP, AlAs, GaAsP, AlGaAs, SiC or BP, but any material that can form p-semiconductor can be used for this purpose, and particularly preferred is a material of indirect transition type with a large band gap.

Figure 2:
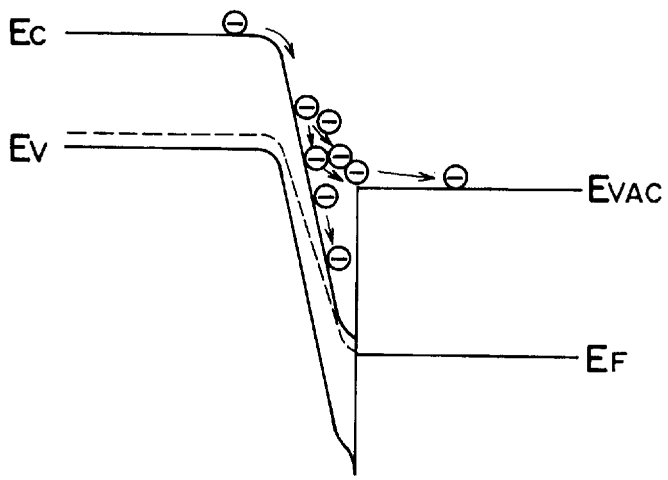
FIG. 2 is a chart showing the energy bands in the vicinity of the surface of the electron emitting semiconductor device of the present invention.

FIG. 2 shows the energy bands in the vicinity of the surface of the electron emitting semiconductor device of the present invention.

In the following there will be explained the electron emitting process of the electron emitting semiconductor device of the present invention.

Under the application of an inverse bias voltage to a Schottky diode consisting of the p-type semiconductor and the work function reducing material, the bottom Ec of the conduction band of the p-type semiconductor assumes an energy level higher than the vacuum level $E_{vac}$ of the Schottky electrode. Electrons generated by the avalanche amplification acquire an energy higher than the lattice temperature by an electric field in the depletion layer generated at the interface of the semiconductor and the metal electrode, and are injected into the Schottky electrode consisting of the work function reducing material. Thus said electrons, of which energy is not lost for example by lattice scattering and is therefore higher than the work function of the surface of the Schottky electrode, are emitted into the outer vacuum space from the surface of said Schottky electrode constituting the electron emitting part.

In the electron emitting semiconductor device of the present invention, because of the presence of an $N^+$ area in the vicinity of the interface of the work function reducing material in the P-type semiconductor substrate, there is generated a depletion layer at the P-$N^+$ interface. Consequently the electrons injected from the $P^+$ -type layer into the P-type layer are restricted in their moving path by said depletion layer at the P-$N^+$ interface and are concentrated in a $P^+$-type area unit provided in the electron emitting part, whereby the current density can be easily increased.

Also in the device of the present invention, since the $P^+$-type area unit and the $N^+$-type area constituting the electron emitting part can be formed for example by ion implantation from the surface of the semiconductor substrate in the device manufacturing process, there can be formed plural electron emitting parts of arbitrary shapes, at arbitrary positions on a same plane of a substrate.

Also as desired semiconductive layers can be deposited in succession for example by MBE (molecular beam epitaxy) on a semiconductive substrate, the electron emitting part can be constructed with such successively deposited layer. It is therefore possible to form plural electron emitting parts in a direction perpendicular to the surface of the substrate.

Furthermore, according to the present invention, the plural $P^+$-type area units may be arbitrarily positioned in the P-type semiconductor layer, so that an electron beam of an arbitrary shape can be obtained.

[1st embodiment]

Figure 3A:
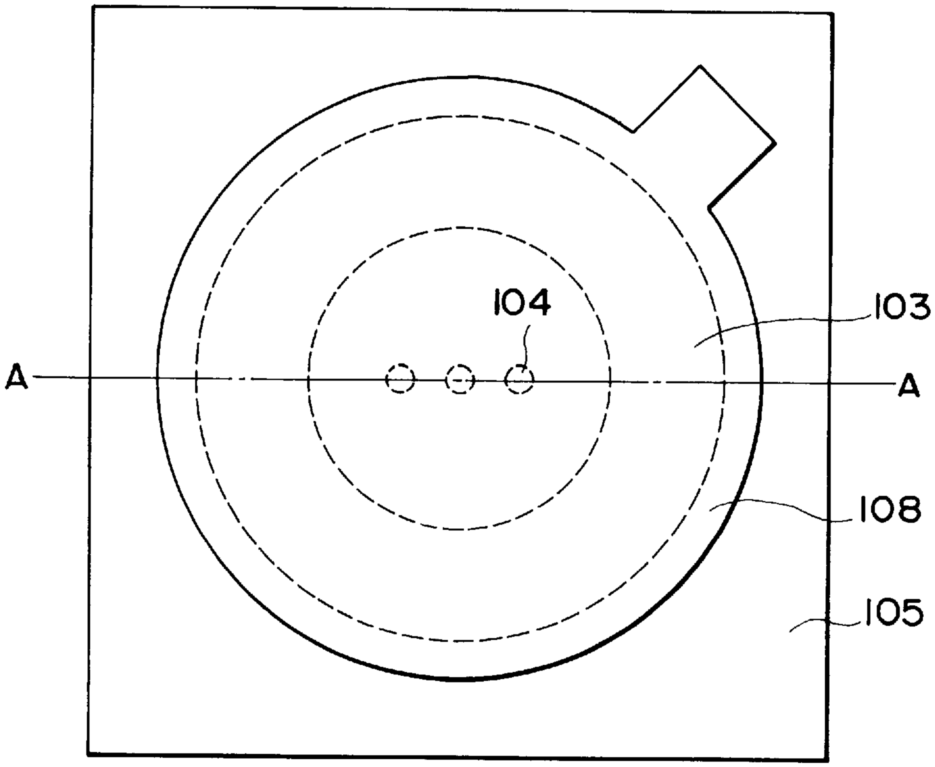
FIGS. 3A and 3B are schematic views of an electron emitting GaAs semiconductor device constituting a first embodiment of the present invention.
Figure 3B:
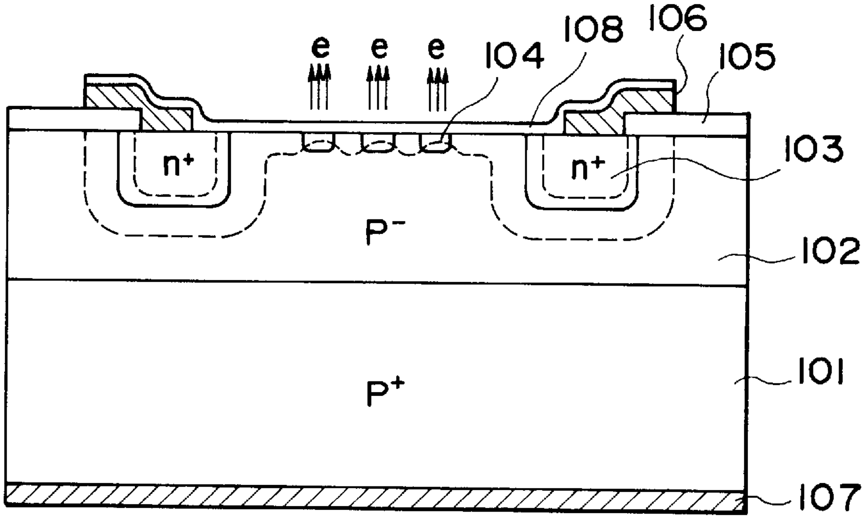

FIG. 3A is a plan view and FIG. 3B is a cross-sectional view along a line A—A in FIG. 3A, both schematically showing an electron emitting GaAs semiconductor device constituting an embodiment of the present invention, wherein shown are a $P^+$-type Si substrate 101; a $P^-$-type layer 102; an annular $N^+$-area 103; a point-shaped $P^+$-type area unit 104; an insulating film 105; ohmic electrodes 106, 107; and a Schottky electrode 108.

In the following there will be explained the method of producing the electron emitting semiconductor device shown in FIGS. 3A and 3B. (1) On a $P^+$-type Si substrate 101 doped with As with an impurity concentration of $1\times10^{19}$ $cm^{-3}$, a $P^-$-type layer 102 with an As concentration of $3\times10^{18}$ was formed by CVD (chemical vapor deposition) or LPE (liquid phase epitaxy).

(2) Then apertures for the areas 103, 104 were formed by an ordinary photolithographic process, and ion implantations were conducted with $B^+$ ions for the annular $N^+$type -area 103 to obtain an impurity concentration of $1\times10$ $cm^{-3}$, and with As ions for the point-shaped $P^+$-type area units 104 to obtain an impurity concentration of $1\times10^{20}$ $cm^{-3}$, and activation was conducted by annealing.

(3) Then a $SiO_2$ insulating film 105 was formed by vacuum evaporation, and an aperture was formed therein by a photolithographic process.

(4) Aluminum was vacuum evaporated on the annular $N^+$-type area 103 and on the rear surface of the substrate to form ohmic electrodes 106, 107.

(5) Then, as the material constituting the Schottky electrode 108, a work function reducing material Ga ($\phi_{wk}$=3.1 eV) was deposited by vacuum evaporation in a thickness of 100 Å. Then, a heat treatment for 10 minutes at 350° C. was conducted to form $GaSi_2$, forming a satisfactory Schottky junctions with the point-shaped $P^+$-type area units 104.

In the electron emitting semiconductor device prepared as explained above, the application of an inverse bias voltage to the Schottky barrier diode 108 induced avalanche amplification at the interface between the Schottky electrode 108 and the point-shaped $P^+$-type area 104, whereby electrons of high energy were emitted from the GaSi surface.

As explained in the foregoing, in the present embodiment, the presence of the $P^+$-type area unit for concentrating the electric field and limiting the electron emitting part limits the point of electron emission, so that the distribution of electron emission in a device can be arbitrarily designed by the arrangement of said point-shaped P-type area and the size of the $P^+$-type area unit.

Furthermore, the electron emitting device of the present invention easily allows minituarization or integration of multiple devices because the conventional semiconductor process can be utilized for the preparation.

[2nd embodiment]

Figure 4A:
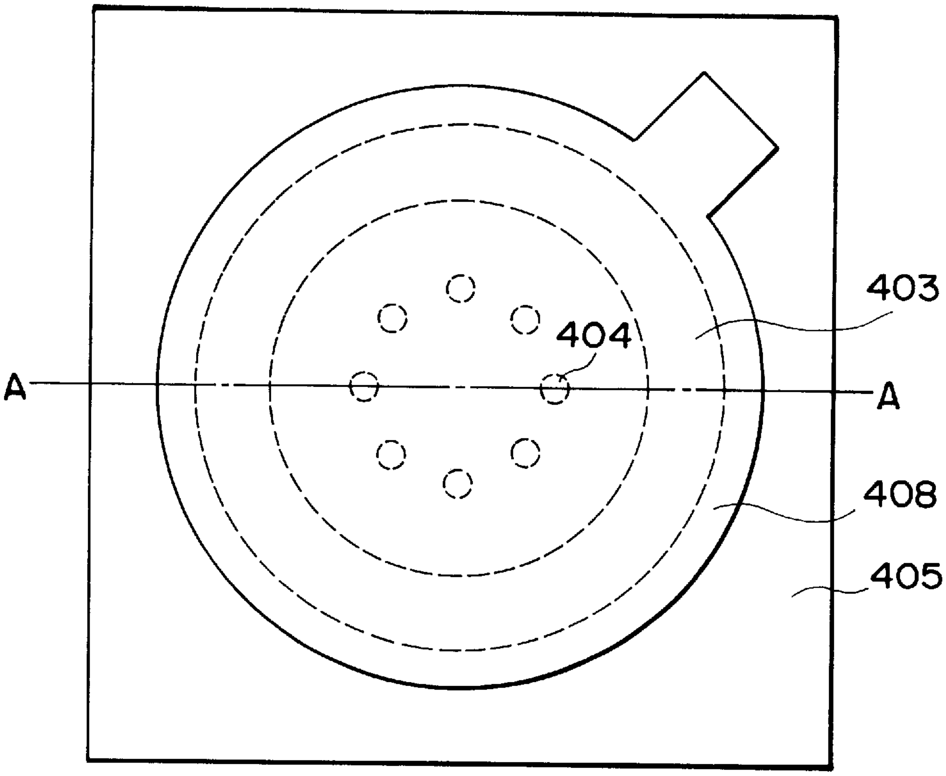
FIGS. 4A and 4B are schematic views of an electron emitting GaAs semiconductor device constituting a second embodiment of the present invention.
Figure 4B:
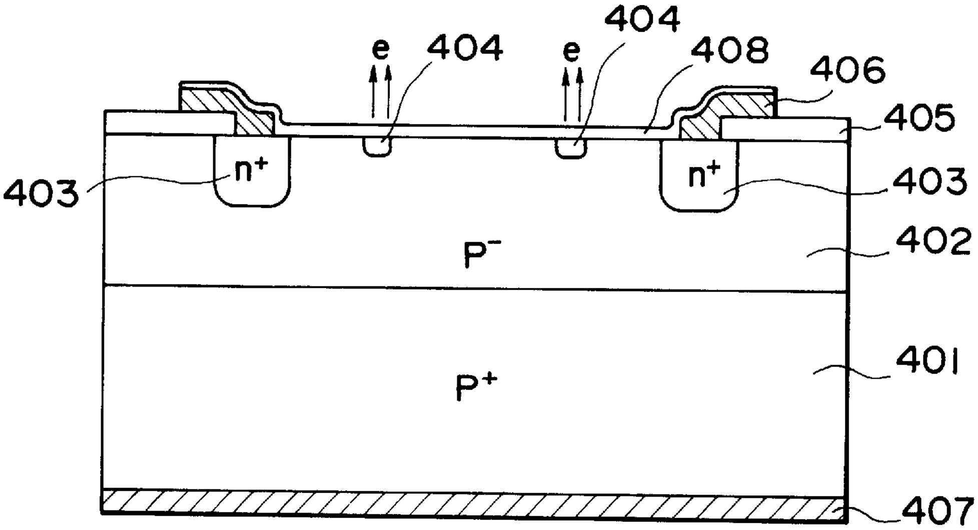

FIG. 4A is a plan view, and FIG. 4B is a cross-sectional view along a line A—A in FIG. 4A, both showing an electron emitting GaAs semiconductor device constituting a second embodiment of the present invention, wherein shown are a $P^+$-type Si substrate 401; a $P^-$-type layer 402; an annular $N^+$-type area 403; a point-shaped $P^+$-type area unit 404; an insulating film 405; ohmic electrodes 406, 407; and a Schottky electrode 408.

In the following there will be explained the method for producing the electron-emitting semiconductor device shown in FIG. 4.

(1) On a $P^+$-type GaAs substrate 401 with an impurity concentration of $5\times10$ cm , there was epitaxially grown a $P^-$-type GaAs layer 402 with an impurity concentration of $1\times10^{18}$ cm by MEB (molecular beam epitaxy) or MO-CVD (metalorganic chemical vapor deposition), employing Be as the P-impurity.

(2) Maskless ion implantation was conducted with FIB (focused ion beam), employing Si for the annular $N^+$-type area 403 with an accelerating voltage of 160 keV and $Be^+$ for the point-shaped $P^+$-type area unit 404 with an accelerating voltage of 40 keV.

(3) Subsequently $SiO_2$ was deposited by vacuum evaporation on both faces of the substrate 401, and the implanted impurities were activated by annealing for 3 minutes at 850° C.

(4) Then $SiO_2$ was entirely removed from the rear face of the substrate, and the interior alone of the annular $N^+$-type area on the top face was etched to obtain the insulating film 405.

(5) Then Au-Zn alloy and Au-Ge alloy were deposited by vacuum evaporation respectively on the rear face of the $P^+$-type substrate 401 and on the $n^+$-type area of $P^-$-type GaAs layer 402. After the Au-Ge alloy film on the top face was patterned, heat treatment was applied for 3 minutes at 400° C. to obtain the ohmic electrodes 406, 407.

(6) Finally $LaB_6$, which is a work function reducing material ($\phi_{WT}$=2.6 eV) capable of forming satisfactory Schottky junction to the positive holes of GaAs, was deposited by electron beam evaporation, thereby forming the Schottky electrode.

The electron emitting semiconductor device prepared in this manner was placed in a vacuum chamber maintained at $2\times10^{-7}$ Torr, and was given an inverse bias voltage of 7V, whereupon electron emission of about 1 nA was observed.

[3rd embodiment]

Figure 5:
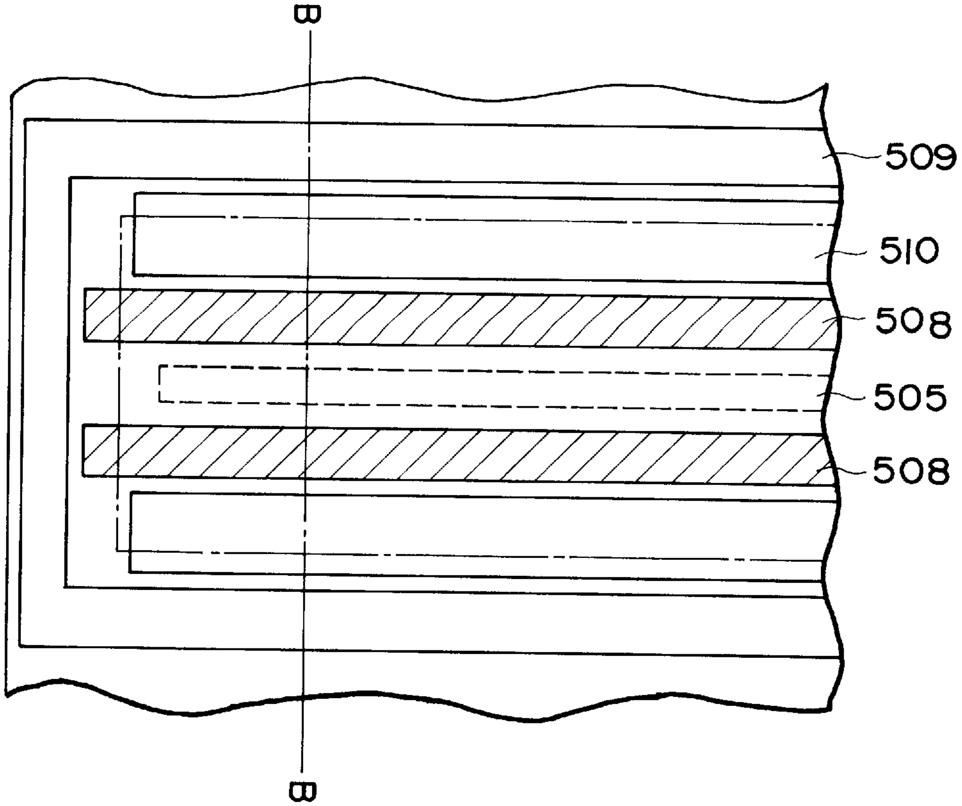
FIG. 5 is a schematic plan view of an electron emitting semiconductor device constituting a third embodiment of the present invention.
Figure 6:
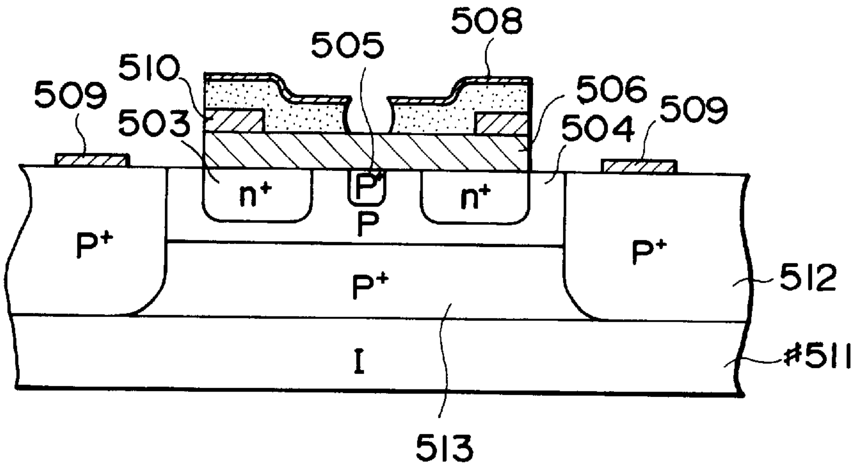
FIG. 6 is a cross-sectional view along a line B—B in FIG. 5.

FIG. 5 is a plan view, and FIG. 6 is a cross-sectional view along a line B—B in FIG. 5, both showing an electron emitting semiconductor device constituting a third embodiment of the present invention.

In the following there will be explained the method for producing the device shown in FIGS. 5 and 6.

(1) On an insulating Si substrate 511, there were grown a $P^+$-type layer 513 of an impurity concentration of $1\times10^{19}$ $cm^{-3}$ and a P-type semiconductor layer 504 of an impurity concentration of $3\times10^{16}$ $cm^{-3}$ by CVD (chemical vapor deposition) or LPD (liquid phase epitaxy).

(2) Then apertures for the areas 503, 505, 512 were formed by an ordinary photolithographic process, and $As^+$ ions were implanted with an impurity concentration of $1\times10^{20}$ $cm^{-3}$ in the $P^+$-type area units 505, 512 and were activated by annealing.

(3) Subsequently a work function reducing material constituting the Schottky electrode 506, for example Gd ($\phi_{WK}$= 3.1 eV), was deposited in a thickness of 100 Å by vacuum evaporation, and a satisfactory Schottky junction was formed by heat treatment for 10 minutes at 350° C.

(4) Then, the electrode 508 and ohmic electrode 509 were formed by aluminum evaporation on an insulating layer on said Schottky electrode 506.

In the electron emitting semiconductor device prepared as explained above, the application of an inverse bias voltage to the Schottky diode induced avalanche amplification at the interface between the Schottky electrode 506 and the $P^+$-area unit 505, whereby electrons of high energy were emitted from the $GdSi_2$ surface.

As explained in the foregoing, the present embodiment has a line-shaped $P^+$-type area unit 505 for concentrating the electric field and limiting the electron emitting part as shown in FIG. 5, so that the electron emission can be obtained continuously over a wide area. Consequently it can be utilized as the electron source for flat panel displays or other display devices in which a linear cathode has been employed.

Also the electron emitting semiconductor device of the present embodiment can be made as a large device or in a large area, because it is a silicon device utilizing the conventional semiconductor process.

[4th embodiment]

In the following there will be explained a fourth embodiment of the present invention, in which the electron emitting semiconductor device of the present invention is applied in a 7-segment image display device, with reference to FIGS. 7 and 8.

Figure 7:
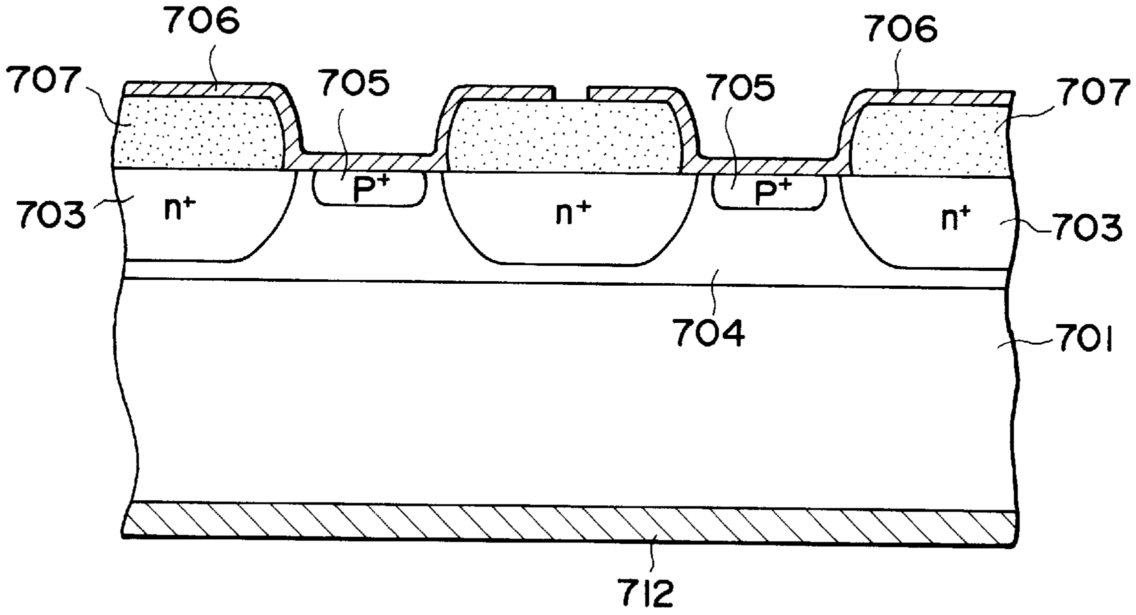
FIG. 7 is a schematic cross-sectional view of a part of an electron emitting semiconductor device constituting a fourth embodiment of the present invention.
Figure 8:
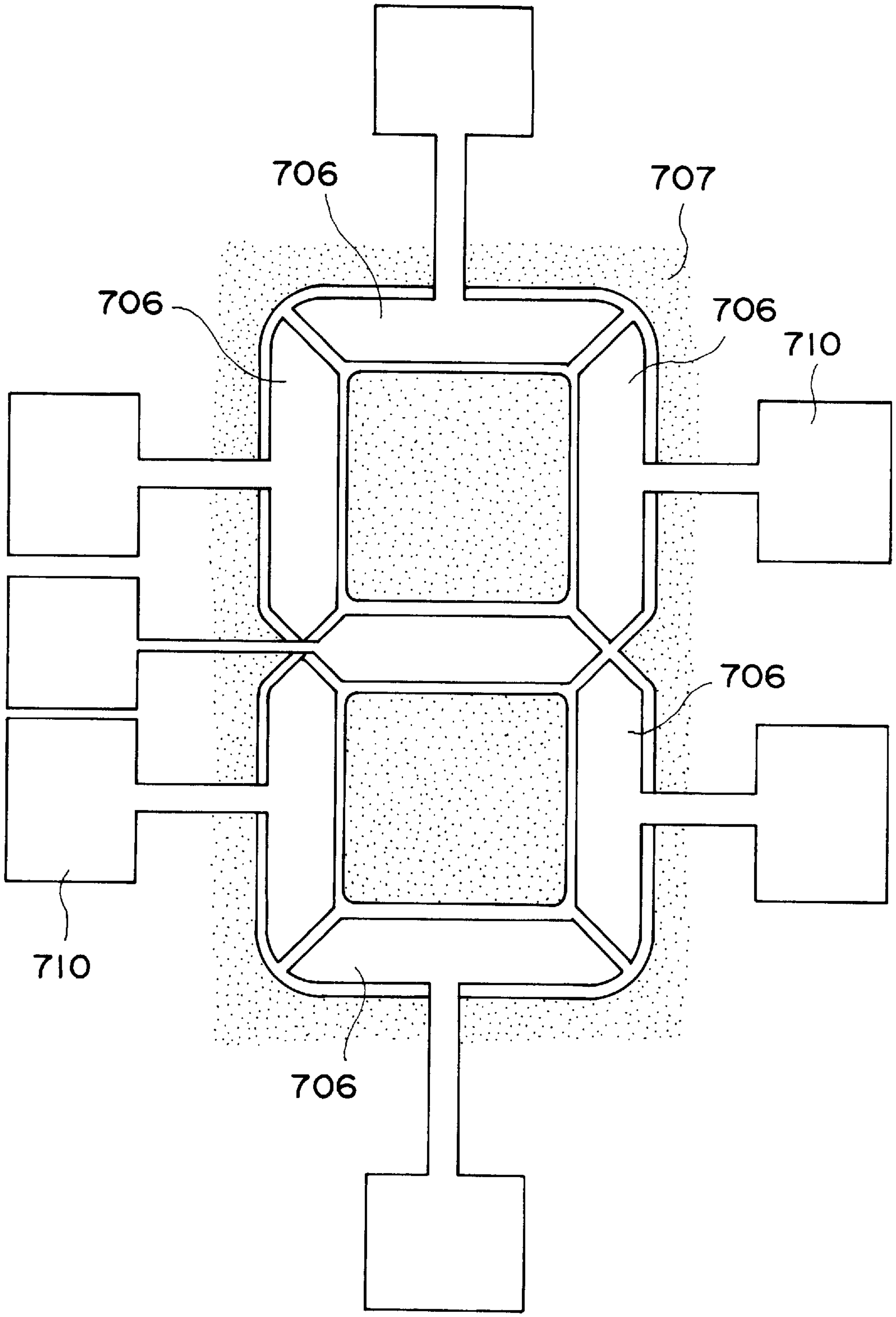
FIG. 8 is a schematic plan view thereof.

FIG. 7 is a schematic cross-sectional view of a part of the electron emitting semiconductor device of the present embodiment, and FIG. 8 is a schematic plan view thereof.

In the following there will be explained the method for producing said device shown in FIGS. 7 and 8.

(1) On a $P^+$-type GaAs substrate 701 of an impurity concentration of $5\times10^{18}$ $cm^{-3}$, there was epitaxially grown a P-type GaAs layer 704 of an impurity concentration of $1\times10$ $cm^{-3}$ by MBE (molecular beam epitaxy) utilizing Be as the P-type impurity.

(2) Then an $N^+$-type layer 703 was formed by maskless ion implantation with an FIB (focused ion beam) of $Si^+$ into the P-type GaAs layer 704 with an accelerating voltage of 80 keV and a dose of about $5\times10^{13}$ $cm^{-2}$ (3) Then $P^+$-type area units 705 constituting electron emitting areas were formed by ion implantation with an FIB of an accelerating voltage of 50 kV and a dose of about 1×10 $cm^{-3}$.

Said $P^+$-type area units 705 constitute seven electron emitting areas for displaying the 7-segment image.

(4) Then a $SiO_2$ layer was formed by sputter evaporation on the substrate 701 having the $N^+$-type area 703 and the $P^+$-type area units 705 thereon, and heat treatment for 3 minutes at 800° C. was applied in mixed gas of arsine, $N_2$ and $H_2$ to activate the implanted impurities.

(5) Then $SiO_2$ on the $P^+$-type area units 705 was removed to expose said area units, and $LaB_6$ ($\phi_{WT}$=2.6 eV) which is a work function reducing material capable of forming a satisfactory Schottky junction to the positive holes of GaAs was deposited in a thickness of about 200 Å by electron beam evaporation, thereby forming a Schottky electrode independently for each segment.

(6) Finally an ohmic electrode was formed on the rear face of the $P^+$-type substrate with Au-Zn alloy whereby the electron emitting device was completed.

The electron emitting semiconductor device thus completed was placed in a vacuum container maintained at $1\times10^{-6}$ Torr, and a fluorescent plate was placed at a distance of 2 mm. By the electron emission from the device, there were observed luminous points corresponding to seven segments of said device. The electron emission was obtained only from segments in which the Schottky electrode was given a positive voltage, so that the display of numerals was possible by the combinations of seven segments.

As explained in the foregoing, the electron emitting device of the present invention is capable of arbitrarily limiting the electron emitting part, and simultaneously forming plural electron emitting parts on a same substrate.

Furthermore, the electron emitting device of the present invention is capable of electron emission in a direction perpendicualr to the cross section of the substrate, and is also capable of electron emissions in plural independent directions by forming the electron emitting cross sections in plural directions.

Also said device can be easily applied for example to a display, since the shape of the electron emitting part can be controlled by the $P^+$-type layer embedded in the P-type layer.

What is claimed is:

1. An electron emitting semiconductor device comprising:

a P-type semiconductor layer formed on a semiconductor substrate;

a Schottky barrier electrode formed on said P-type semiconductor layer;

a plurality of point-shaped $P^+$ area units positioned under and facing said Schottky barrier electrode; and an $N^+$ type area in the vicinity of said $P^+$ area units, wherein said P+ area units limit points of electron emission.

2. An electron emitting semiconductor device according to claim 1, wherein said Schottky barrier electrode comprises at least a material selected from the group consisting of Gd, $LaB_6$, TiC, ZrC, HfC, $SmB_6$, $GdB_6$, $WSi_2$, $TiSi_2$, $ZrSi_2$ and $GdSi_2$.

3. An electron emitting semiconductor device according to claim 1, wherein said P-type semiconductor layer comprises at least a material selected from the group consisting of Si, Ge, GaAs, GaP, AlAs, GaAsP, AlGaAs, SiC and BP.

4. An electron emitting semiconductor device according to claim 1, wherein said Schottky barrier electrode has a thickness of at most 20 nm.

5. An electron emitting semiconductor device according to claim 4, wherein said Schottky barrier electrode has a thickness in a range from 5 nm to 15 nm.

6. An electron emitting semiconductor device according to claim 1, wherein said plurality of $P^+$-type area units are shaped into predetermined configurations.

7. A device according to claim 1, wherein said $N^+$ type area is disposed so as to surround said $P^+$ area units and is annular.

* * * * *

UNITED STATES PATENT AND TRADEMARK OFFICE
CERTIFICATE OF CORRECTION

PATENT NO. : 5,814,832

DATED : September 29, 1998

INVENTOR(S): TOSHIKO TAKEDA ET AL.

It is certified that error appears in the above-identified patent and that said Letters Patent is hereby corrected as shown below:

ON COVER PAGE AT [56] REFERENCES CITED, ATTORNEY, AGENT OR FIRM

Insert: --Attorney, Agent or Firm-Fitzpatrick, Cella, Harper & Scinto--.

COLUMN 1

Line 66, "plurality" should read --a plurality--;
Line 67, "$P^+$ type-area" should read --of $P^+$-type area--.

COLUMN 2

Line 43, "by" should read --be--;
Line 46, "use of" should read --use of the-- and "the material" should read --a material--;
Line 53, "lanthanoid," should read --the lanthanoids,--;
Line 55, "$LaB_6r$" should read --$LaB_6$,--;
Line 63, "difficulty" should read --usual difficulties--.

COLUMN 3

Line 1, "following" should read --following,--;
Line 7, "n area" should read --$N^+$-area--;
Line 8, "n-ohmic" should read --N-ohmic--;
Line 9, "p-ohmic electrode." should read --P-ohmic electrode 19.---.

CERTIFICATE OF CORRECTION

PATENT NO. : 5,814,832

DATED : September 29, 1998

INVENTOR(S): TOSHIKO TAKEDA ET AL.

It is certified that error appears in the above-identified patent and that said Letters Patent is hereby corrected as shown below:

COLUMN 4

Line 4, "$N^+$-area" should read --$N^+$-type area--;
Line 9, "3B. (1)" should read --3B. ¶ (1)--;
Line 16, "$N^+$type" should read --$N^+$-type--;
Line 17, "-area 103" should read --area 103--

Line 18, "As ions" should read --$As^+$ ions--;
Line 31, "a" should be deleted--;
Line 63, "5 x 10 cm," should read --5 x $10^{18}$ $cm^{-3}$,--;
Line 65, "1 x $10^{18}$ cm" should read --1 x $10^{18}$ $cm^{-3}$--.

COLUMN 5

Line 2, "Si" should read --$Si^{2+}$--;
Line 16, "$n^+$-type" should read --$N^+$-type--;
Line 58, "$P^+$-area" should read --$P^+$-type area--.

COLUMN 6

Line 18, "1 x 10 $cm^{-3}$" should read --1 x $10^{16}$ $cm^{-3}$--;
Line 23, "5 x $10^{13}$ $cm^{-2}$" should read --5 x $10^{13}$ $cm^{-2}$.--;
Line 26, "1 x 10" should read --1 x $10^{13}$--;
Line 60, "perpendicualr" should read --perpendicular--.

UNITED STATES PATENT AND TRADEMARK OFFICE

CERTIFICATE OF CORRECTION

PATENT NO. : 5,814,832

DATED : September 29, 1998

INVENTOR(S): TOSHIKO TAKEDA ET AL.

It is certified that error appears in the above-identified patent and that said Letters Patent is hereby corrected as shown below:

COLUMN 7

Line 7, "$P^+$area" should read --$P^+$-area--;
Line 9, "$N^+$ type" should read --$N^+$-type-- and "$P^+$ area" should read --$P^+$-area--;
Line 10, "P+ area" should read --$P^+$-area--.

COLUMN 8

Line 13, "$N^+$ type" should read --$N^+$-type--;
Line 14, "$P^+$ area" should read --$P^+$-area--.

Signed and Sealed this

Seventh Day of September, 1999

Attest:

Q. TODD DICKINSON

Attesting Officer

Acting Commissioner of Patents and Trademarks